United States Patent
Pelc

(10) Patent No.: US 6,976,953 B1
(45) Date of Patent: Dec. 20, 2005

(54) MAINTAINING THE ALIGNMENT OF ELECTRIC AND MAGNETIC FIELDS IN AN X-RAY TUBE OPERATED IN A MAGNETIC FIELD

(75) Inventor: Norbert J. Pelc, Los Altos, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 73 days.

(21) Appl. No.: 10/259,225

(22) Filed: Sep. 26, 2002

Related U.S. Application Data

(63) Continuation-in-part of application No. 09/823,889, filed on Mar. 30, 2001.

(60) Provisional application No. 60/193,731, filed on Mar. 30, 2000, provisional application No. 60/193,735, filed on Mar. 30, 2000.

(51) Int. Cl.$^7$ .............................................. A61B 5/05
(52) U.S. Cl. ....................................................... 600/44
(58) Field of Search ........................ 600/411, 407, 408, 600/409, 410; 250/214; 378/138; 324/306, 324/307, 308, 309

(56) References Cited

U.S. PATENT DOCUMENTS

| | | | | |
|---|---|---|---|---|
| 4,455,277 A | * | 6/1984 | Schlitt ......................... 376/103 |
| 5,077,774 A | * | 12/1991 | Piestrup et al. ............. 378/119 |
| 5,125,019 A | | 6/1992 | Evain et al. ................. 378/137 |
| 5,369,679 A | * | 11/1994 | Sliski et al. .................. 378/65 |
| 5,442,678 A | * | 8/1995 | Dinsmore et al. .......... 378/137 |
| 5,528,652 A | * | 6/1996 | Smith et al. .................. 378/65 |
| 5,550,889 A | | 8/1996 | Gard et al. .................. 378/113 |
| 5,563,407 A | | 10/1996 | Yamagishi ................... 250/214 |
| 5,713,357 A | * | 2/1998 | Meulenbrugge et al. .... 600/411 |
| 5,757,118 A | | 5/1998 | Kubo ......................... 313/365 |
| 5,807,254 A | | 9/1998 | Meulenbrugge et al. .... 600/411 |
| 5,818,901 A | * | 10/1998 | Schulz ......................... 378/63 |
| 6,031,888 A | * | 2/2000 | Ivan et al. .................... 378/20 |
| 6,055,294 A | | 4/2000 | Foerst et al. ................ 378/138 |
| 6,101,239 A | | 8/2000 | Kawasaki et al. ............ 378/63 |

(Continued)

OTHER PUBLICATIONS

F, D. Becchetti et al., "Magnetic confinement of radiotherapy beam-dose profiles," Cyclotrons and Their Applications 2001, Sixteenth International Conference (AIP Press), pp. 44-46.

(Continued)

*Primary Examiner*—Daniel Robinson
(74) *Attorney, Agent, or Firm*—Lumen Intellectual Property Services, Inc.

(57) ABSTRACT

A new technique for maintaining the alignment of electric and magnetic fields in an x-ray tube so the tube can be operated in the presence of a static external magnetic field without being negatively affected thereby. Deflection of the electron beam of the x-ray tube by the high magnetic field is reduced or eliminated by modifying or canceling, at a location near the electron beam, the magnetic field components transverse to the beam. In a preferred embodiment, a set of electromagnet coils are positioned on or near the tube and oriented in a way that when current is applied internal magnetic fields are produced in a direction opposite to the transverse magnetic fields, thereby causing cancellation. In one implementation, one or more sensors are used to detect the transverse magnetic fields. The sensor is positioned near the electron beam, either inside or outside the x-ray tube. The sensor produces a signal dependent on a static magnetic field component transverse to the desired direction of the electron beam. This signal is used to control the amount of current applied to the coils. A controller and a feedback circuit may be included to adjust in real time the amount of current being applied.

15 Claims, 4 Drawing Sheets

U.S. PATENT DOCUMENTS

| | | | |
|---|---|---|---|
| 6,151,384 A | 11/2000 | Reed et al. | 378/138 |
| 6,233,474 B1 * | 5/2001 | Lemelson | 600/411 |
| 6,256,371 B1 * | 7/2001 | Hasegawa et al. | 378/34 |
| 6,658,085 B2 | 12/2003 | Sklebitz | 378/63 |

OTHER PUBLICATIONS

Dale W Litzenberg et al., "An apparatus for applying strong longitudinal magnetic fields to clinical photon and electron beams," Phys Med Bio V46 No. 5, pp. N105-N115, (2001).

Frederick D. Becchetti et al., "High energy electron beams shaped with applied magnetic fields could provide a competitve and cost-effective alternative to proton and heavy-ion radiotherapy," Med Phys 29 (10), Oct. 2002, pp. 2435-2437.

* cited by examiner

MAINTAINING THE ALIGNMENT OF ELECTRIC AND MAGNETIC FIELDS IN AN X-RAY TUBE OPERATED IN A MAGNETIC FIELD

CROSS-REFERENCE TO RELATED APPLICATIONS

This is a continuation-in-part application of an earlier filed non-provisional application Ser. No. 09/823,889, filed Mar. 30, 2001, which claims the benefit of U.S. Provisional Application Nos. 60/193,731 and 60/193,735, both filed Mar. 30, 2000.

STATEMENT REGARDING FEDERALLY SPONSORED RESEARCH OR DEVELOPMENT

This invention was supported in part by grant number P41 RR09784 from the National Institutes of Health (NIH). The U.S. Government has certain rights in the invention.

FIELD OF THE INVENTION

This invention relates generally to imaging systems and methods, for example, for medical imaging and non-destructive testing, combining magnetic resonance imaging (MRI) and x-ray imaging in the same location. More particularly, it relates to an improved technique for controlling and maintaining the alignment of electric and magnetic fields in an x-ray tube operated in the presence of a magnetic field.

BACKGROUND ART

Magnetic resonance imaging (MRI) and x-ray fluoroscopic imaging are important imaging tools. For example, in medical imaging they are routinely used for diagnosing disease and for image-guided interventional procedures. Each method provides its own advantages: MRI provides excellent soft tissue contrast, three-dimensional visualization, physiological information, and the ability to image in any scan plane, while x-ray imaging offers much higher spatial and temporal resolution in a projection format, useful for visualization and placement of guidewires, catheters, stents, and other medical devices. Combining the two imaging systems therefore offers significant benefits over using each system alone. Currently, several approaches are used for combining the systems. In one, an x-ray fluoroscope is located in a room adjacent to the MRI system. In another, the x-ray and MRI systems are in the same room, but the patient must be moved out of the magnetic field to be imaged by the x-ray system. Moving the patient is undesirable, because it is time consuming, possibly dangerous, and can render the images inconsistent. Therefore, one wants to minimize the distance between the two systems, and perhaps overlap them. This will place critical components of the x-ray system within a high magnetic field.

The ideal system is one in which x-ray imaging and magnetic resonance imaging can be performed in the same location, eliminating the need to move the patient. Before a combined MRI and x-ray system can be constructed, however, the individual systems must be modified to ensure that the high magnetic field of the MRI system does not affect the x-ray system, and that the x-ray system does not disturb the operation of the MRI system. For example, conventional x-ray fluoroscopy detectors are image intensifiers, which are exceedingly sensitive to magnetic fields and therefore cannot be used near, let alone inside, an MRI system. However, flat panel x-ray detectors that are relatively immune to magnetic field effects are now available.

A major obstacle to combining MRI and x-ray systems is the x-ray source, which consists of an x-ray tube and its housing. X-rays are generated using an x-ray tube, in which electrons are accelerated from a heated cathode to an anode by a very high potential (e.g., 50 to 150 kV). Interactions between the high energy electrons of the beam and atoms of the anode target material cause deceleration of the electrons and production of x-ray photons.

FIG. 1 is a schematic diagram of an x-ray tube 10 of the prior art. The tube 10 is evacuated and contains a tungsten filament cathode 12 and a more massive anode 14, typically a copper block 16 with a metal target 18 plated on or embedded in the copper surface. The target 18 is most often tungsten, but other metals can be used, such as molybdenum, rhodium, silver, iron, or cobalt. Separate circuits are used to heat the filament 12 and to accelerate the electrons to the target 18. The accelerating potential determines the spectrum of wavelengths (or photon energies) of the emitted x-rays. A high voltage is connected between the cathode 12 and anode 18 to provide the accelerating potential. Typically, the anode and cathode voltages are plus and minus half of the accelerating voltage, respectively. X-rays generated at the target 18 exit the tube 10 through an x-ray transparent window 20 and are directed toward the object being imaged.

When an x-ray tube is operated within or near an MRI system, it experiences the static magnetic field $B_o$, as illustrated schematically in FIG. 2. The magnetic field at the location of the x-ray tube can exert a force on moving electrons and may deflect or defocus the electron beam. The force on an electron is proportional to the cross-product of the velocity of the electron and the magnetic field; that is, only the velocity component that is perpendicular to the magnetic field is perturbed. This will alter the direction of the electron motion, thereby making the direction of the deflecting force time-dependent. In the example of FIG. 2, the electrons are emitted from the cathode with some initial velocity and are accelerated toward the anode by the electric field E. The macroscopic result of the time-dependent force is to produce a deflection away from what would be observed without $B_o$ present, with a deflection in the direction of $B_o$, and an additional deflection of the beam $v_{\perp drift}$ in a direction perpendicular to both $B_o$ and the electric field E. Because the ideal electron velocity is in the direction of the target, as is the acceleration caused by the electric field, unless the magnetic field is parallel to the electron beam it will deflect the electrons away from the center of the target, possibly causing them to miss the target entirely. Thus the effect of the static magnetic field of the MRI system on the x-ray tube can be highly undesirable and may damage the tube if it is operated under non-ideal conditions, or it may lower the x-ray intensity to a level that is unacceptable. In the combined system, it is not desirable—indeed it may be impossible—to turn off the static magnetic field before acquiring x-ray images, and so the effect of the magnetic field on the x-ray tube must be addressed.

A number of combined magnetic resonance imaging and x-ray imaging systems are disclosed in the prior art. U.S. Pat. No. 5,713,357, issued to Meulenbrugge et al., discloses a combined system that minimizes or eliminates the distance an object being imaged must be displaced between individual systems. In one embodiment, the object is displaced a small distance along a track between adjacent MRI and x-ray imaging systems with non-coincident fields of view. In another embodiment, the object is not moved and the fields of view of the two systems are coincident, but the x-ray imaging system is moved out of the MRI field of view during MR image acquisition. During x-ray imaging, the x-ray source is either out of range of the static magnetic field, passively shielded from the magnetic field, or positioned so that the electron beam is parallel to the magnetic field. In this alignment, the electron beam should not be deflected by the magnetic field. This technique, however, limits the system in that the x-ray tube must remain fixed at a certain orientation and/or distance with respect to the static magnet. Moreover, Meulenbrugge et al's invention does not teach or suggest how to control/maintain the alignment of the electric and magnetic fields in the x-ray tube.

U.S. Pat. No. 5,818,901, issued to Shulz, discloses a combined system with simultaneous MR and x-ray imaging and coincident fields of view. A solid state x-ray detector containing amorphous hydrated silicon, which is not affected by the magnetic field, is used in place of an image intensifier. The x-ray source is positioned far enough from the MR apparatus that the influence of the magnetic field on the x-ray source is slight. Additionally, the influence is reduced further by surrounding the source with a cladding material that shields the source from the magnetic field. The goal of the cladding or shielding is to reduce the magnetic field at the location of the x-ray source to a level where it can be tolerated.

U.S. Pat. No. 6,031,888, issued to Ivan et al., discloses an x-ray fluoroscopy assist feature for a diagnostic imaging device such as MRI or computerized tomography (CT). X-rays are generated using a rotating anode x-ray tube. There is no mention of the effects of the magnetic field on the x-ray source or of any methods to eliminate such effects.

A medical imaging apparatus containing both x-ray radiographic means and MRI means is disclosed in U.S. Pat. No. 6,101,239, issued to Kawasaki et al. The x-ray and MRI systems have coincident fields of view, and the timing of the image acquisition is controlled so that the x-ray pulses occur only when the gradient magnetic fields and RF magnetic fields fields of the MRI system are off. There is no mention of minimizing or eliminating the effect of the static magnetic field on the x-ray source.

These prior art references offer two solutions to the problem of electron beam deflection in the x-ray tube by the static magnetic field of the MRI system: shielding the tube or aligning the electron beam with the magnetic field. Sufficient cladding to completely eliminate the effect of the magnetic field on the electron beam may not be feasible. Aligning the tube with the magnetic field also has potential problems including that the type and/or the placement of the x-ray tube may be limited and that it may be difficult to rotate the x-ray tube to different orientations around the patient. X-ray tube inserts typically have components that distort the magnetic field and pose additional difficulties. More importantly, since such alignment has a very small tolerance, it is critically difficult to attain.

Use of correcting magnetic fields in imaging systems is known. For example, in the context of x-ray image intensifiers, U.S. Pat. No. 5,757,118, issued to Kubo, uses a correcting electromagnetic coil placed inside a cylindrical magnetic shield surrounding an x-ray image intensifier tube apparatus in combination with a ferromagnetic thin plate placed in front of a convex input window of the tube to produce an internal magnetic field which allows the removal of the rotational distortion and S-shaped distortion of an output image resulting from an external magnetic field that reaches a region inside the input window. Specifically, a direct current is applied to the electromagnetic coil so that a magnetic field is produced in the direction opposite to, and thus cancels part of, the external magnetic field. Kubo does not teach or suggest how to maintain/control the alignment of electric and magnetic fields. Similarly, many MRI systems use electromagnetic "shim coils" to compensate or correct an otherwise inhomogeneous magnetic field. Again, there is no suggestion in that art to control the alignment between electric and magnetic fields.

SUMMARY

Accordingly, it is a primary object of the present invention to provide an x-ray tube that can be operated in the presence of a high magnetic field without being inadvertently affected thereby. The goal is achieved by providing inventive methods and apparatuses for controlling and/or maintaining the alignment of electric and magnetic fields. The inventive methods and apparatuses eliminate magnetic field components transverse to the principal desired direction of travel of the electron beam in the x-ray tube.

The present invention improves the control of the direction of the electron beam onto the x-ray tube target in the inventive MR and x-ray imaging system. Deflection of the electron beam by the static magnetic field is reduced or eliminated by modifying or canceling, at a location near the electron beam, the magnetic field components transverse to the beam. In a preferred embodiment, a set of electromagnetic coils are positioned on or near the tube and oriented in a way such that when current is applied internal magnetic fields are produced in a direction opposite to the direction of the otherwise present transverse magnetic fields. If a correct amount of current is applied to the coils, the coils will generate magnetic fields that exactly oppose the transverse components of the external field, causing cancellation.

One or more sensors can be used to detect the transverse magnetic fields. The sensor is positioned near the electron beam, either inside or outside the x-ray tube. The sensor produces a signal proportional to a static magnetic field component transverse to the beam. This signal is used to control the amount of current applied to the coils. A controller and a feedback circuit may be included to adjust the amount of current applied until the signal from the sensor is zero. This feedback can operate in real-time. Alternative sensors can be used to detect the location of the electron beam rather than the transverse field producing the deflection. Signals from these sensors can are used to control the current in the compensating coils.

DETAILED DESCRIPTION

Although the following detailed description contains many specifics for the purposes of illustration, anyone of ordinary skill in the art will appreciate that many variations and alterations to the following details are within the scope of the invention. Accordingly, the following embodiments of the invention are set forth without any loss of generality to, and without imposing limitations upon, the claimed invention.

The present invention provides a combined magnetic resonance imaging (MRI) and x-ray fluoroscopic imaging apparatus and method. Ideally, the two imaging systems have substantially coincident fields of view (FOV). This allows both types of images to be acquired without moving the object being imaged (e.g., a patient). The invention is particularly advantageous for image-guided interventional procedures, in which x-ray imaging guides placement of guidewires, catheters, or stents, while MR imaging provides soft tissue contrast. Conventional individual systems are modified according to the invention in order to reduce the effect of each system on each other, thereby enabling high quality images to be acquired.

The present invention also provides a modified x-ray tube for use in an external magnetic field. The x-ray tube contains one of a variety of inventive devices for steering the electron beam toward the anode target of the tube. As a result, deflection of the electron beam by the external magnetic field is minimized.

Figure 3:
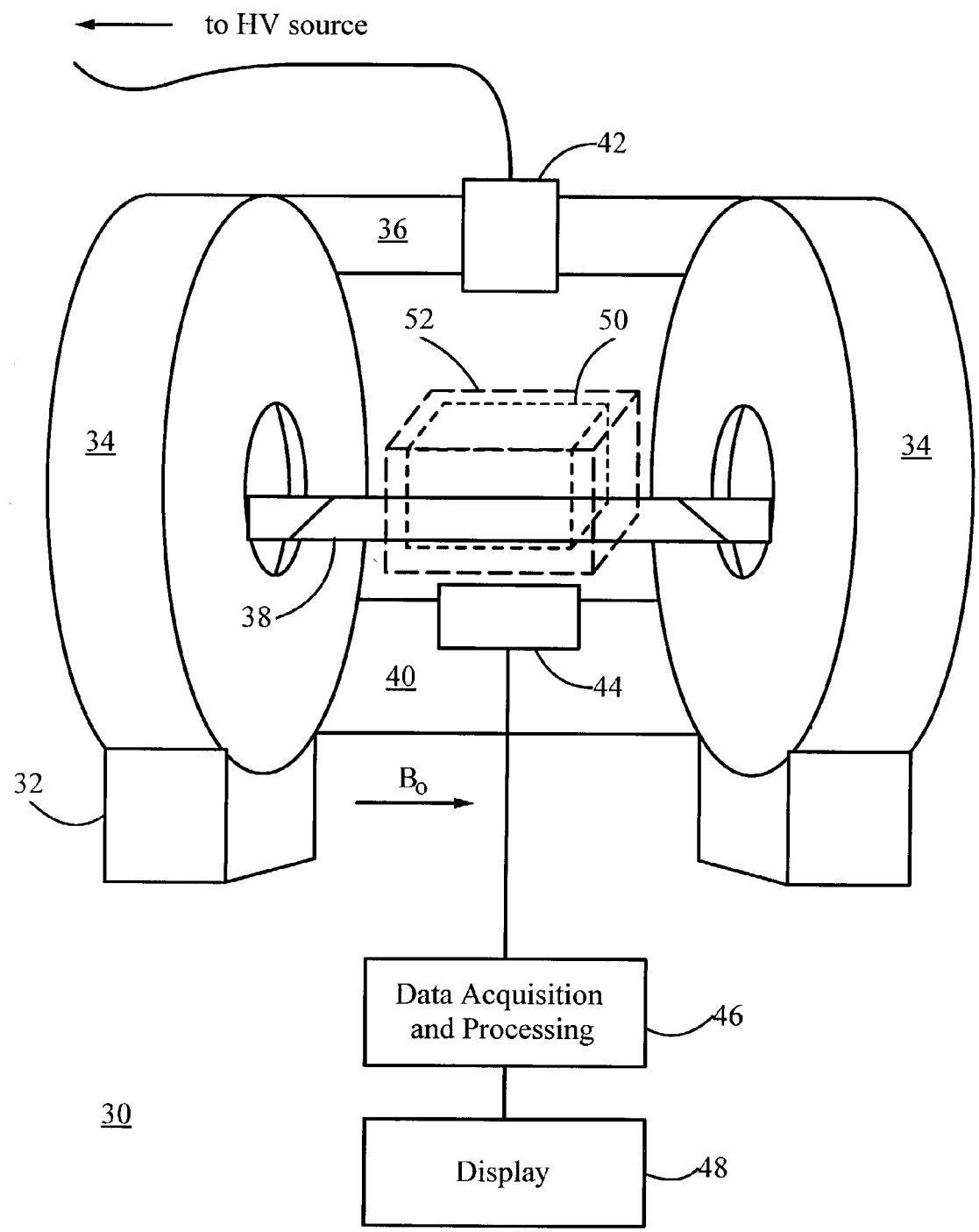
FIG. 3 is a schematic diagram of an imaging apparatus of the present invention.

FIG. 3 is a schematic diagram of an imaging apparatus 30 according to the present invention. As shown, the apparatus 30 contains a standard open-bore double-donut interventional MRI unit 32 containing magnets 34, an upper horizontal enclosure 36, a patient support 38, and a bridge 40 below the patient support 38. The magnets 34 provide a static or main magnetic field $B_o$ in the direction of the arrow. Not shown are standard additional elements such as gradient coils, gradient amplifiers, radio frequency (RF) coils, RF transmitters, MRI data acquisition and processing electronics, and a display. Added to MRI unit 32 are the elements of an x-ray fluoroscopy system: an x-ray source 42, a high voltage generator (not shown), an x-ray detector 44, a detector power supply (not shown), x-ray data acquisition and processing electronics 46, and a display 48. The x-ray source 42 is contained within the upper horizontal enclosure 36, and the x-ray detector 44 is positioned in the bridge 40 below the patient support 38. This positioning provides adequate distances between the x-ray source 42 and the object and between the source 42 and the x-ray detector 44; for example, in a commercial interventional device, the distances are 75 cm and 90 cm, respectively. The patient support 38 is transparent to x-rays.

The orientation of the x-ray system components shown in FIG. 3 provides x-ray imaging in a vertical projection. The x-ray field of view (FOV) is shown by the dashed lined box designated by the reference character 50. X-ray images can be acquired of objects within the x-ray FOV 50. Similarly, the MRI field of view is shown by the dashed lined box designated by the reference character 52. MR images can be acquired of objects within the MRI FOV 52. The two fields of view are referred to herein as substantially coincident when their intersection contains a majority of at least one of the two fields of view. Alternatively, the FOVs can be thought of as substantially coincident when a region of interest of an imaged object can be imaged by both systems without moving the object. Of course, it is not necessary that the x-ray components be positioned as shown in FIG. 3 to provide coincident fields of view. Any suitable positioning of the x-ray components is within the scope of the present invention. For example, it may be desired to acquire x-ray images at different projections, in which case the x-ray source 42 and x-ray detector 44 are mounted on a rotatable support. The invention can also be implemented with a closed bore MRI system, with the x-ray components situated appropriately.

Further, although coincident fields of view is highly desirable, the present invention can be practiced with systems in which the fields of view are not coincident. In fact, when the x-ray tube is not within the bore of the MRI system, the magnetic field is much less controlled than it is within the bore. In this case, it is very difficult to align the desired direction of travel of the electron beam with the magnetic field, and the present invention is particularly useful.

Figure 1:
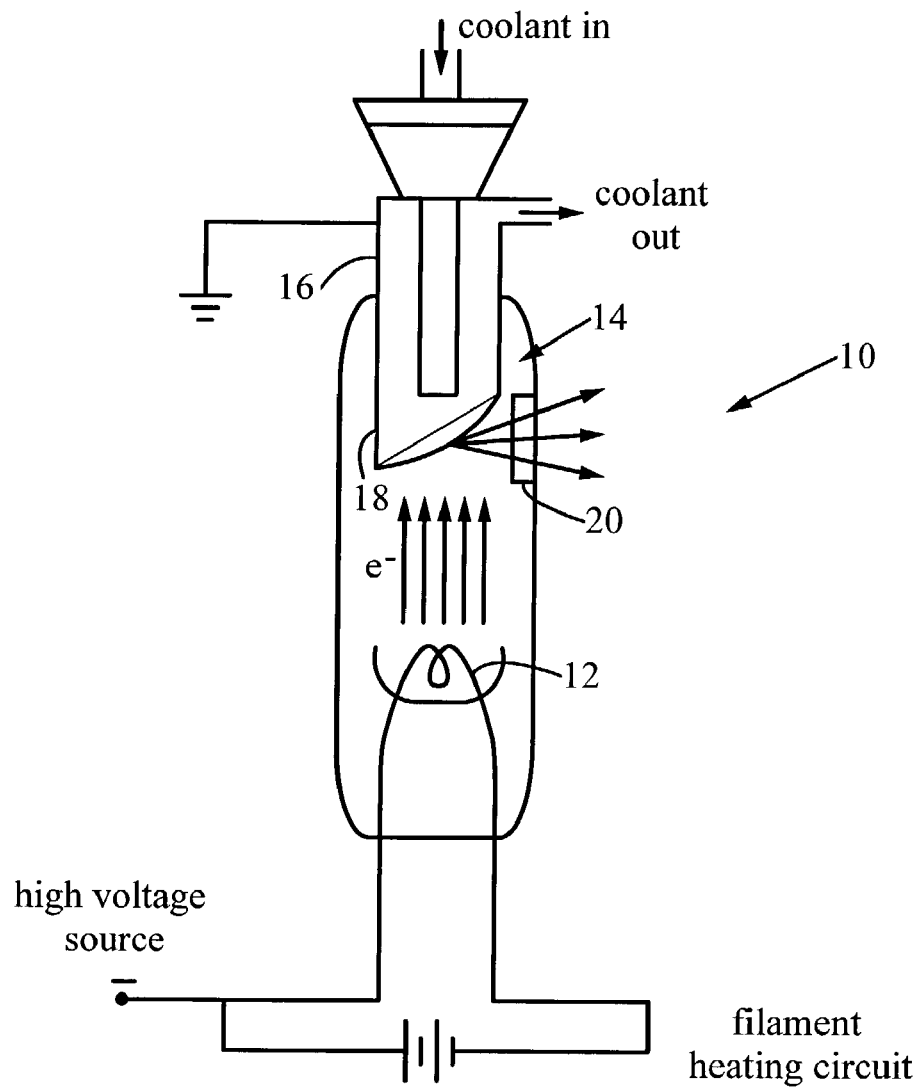
FIG. 1 is a schematic diagram of a prior art x-ray tube.
Figure 2:
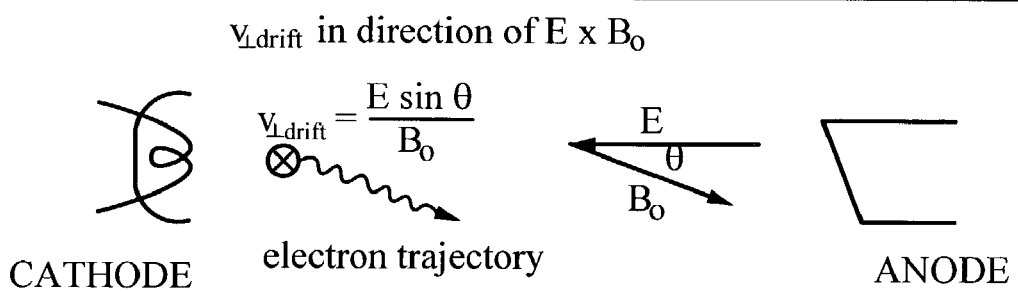
FIG. 2 is a schematic diagram showing the deflection of an electron beam in a magnetic field, as known in the prior art.

In a simple implementation, the individual modalities (i.e. MRI and x-ray) of the apparatus 30 are not active simultaneously, i.e., MR images and x-ray images are not acquired simultaneously, to minimize the detrimental effect of each system on the other. RF interference by the x-ray system on the MRI system is minimized by powering down the x-ray system before acquiring MR images. When x-ray images are acquired, only the main magnetic field of the MRI system is present; other elements, such as the magnetic field gradients and RF magnetic fields, are inactive. However, systems that are capable of simultaneous x-ray and MRI imaging are also within the scope of the present invention. Note that only the x-ray source 42 and x-ray detector 44 must be placed in the static magnetic field. The high voltage power supply and its control (often referred to as the x-ray generator) and the data acquisition and processing electronics 46 and display 48 are preferably located outside of the static magnetic field and connected to the source and detector by shielded cables or fiber-optic coupling. The high voltage source provides both the accelerating voltage between the cathode and anode and the current for heating the cathode filament (see FIG. 1). In systems with a fragile x-ray tube filament, heating the filament with AC power can cause it to break in a magnetic field from mechanical vibration. If desired, the filament power supply in the generator can be modified to rectify and filter the filament power. However, in experiments performed by the present inventors, rectifying the power was unnecessary in at least one tube operated with high frequency AC power.

The x-ray detector 44 is preferably a solid state flat panel detector containing a phosphor conversion layer such as CsI coupled to an amorphous silicon panel having an array of photodiodes and readout electronics. The phosphor layer converts x-ray radiation into visible light, and the photodetectors generate electric signals from the visible light. Such detectors are commercially available. An alternative choice is a flat panel detector coupled to a so-called "direct conversion" photoconducting layer such as amorphous selenium. Charge carriers produced by the x-rays in the photoconductor are swept by an electric field across the converter and read out by the pixel electronics in the flat panel detector. Detectors using CCD devices can also be used.

The x-ray source 42 contains an x-ray tube, a collimator, and a housing. The x-ray tube is preferably a stationary anode x-ray tube. Most x-ray tubes in diagnostic x-ray imaging systems have rotating anodes, which allow high exposure rates without target vaporization. Induction motors used to spin the anode may be significantly affected by the external field, and may distort the magnetic field of the MRI system. Fixed anode tubes provide lower, but still sufficient, intensity, particularly for long, low-dose fluoroscopic exposures, and are compatible with the magnetic field. Use of rotating anode tubes may be feasible, however, especially if non-magnetic means are using to drive the anode rotation. Magnetic components within a standard x-ray tube are replaced with equivalent non-magnetic components, e.g., stainless steel components. The x-ray source housing is typically comprised of lead, brass, and aluminum, all non-magnetic materials. The tube and housing are preferably cooled by passive convection of oil and air, respectively, but actively cooled components are also possible.

As discussed above, the static magnetic field $B_o$ deflects the electron beam of the x-ray source unless the direction of travel is parallel to $B_o$. The present invention provides various additions to the x-ray source that steer the electron beam onto the anode target. The focal spot of an x-ray tube is characterized by the size and location of the focal spot on the target. Typical focal spot sizes for stationary anode x-ray tubes are on the order of 1 mm by 10 mm. In the present invention, the certainty about the location of the focal spot is improved over that which would occur in the presence of a misaligned main magnetic field (i.e., magnetic and electric fields that are not co-aligned) when the additional steering provided by the present invention is not implemented. As a result of the present invention, the focal spot is located closer to the desired location on the x-ray tube target.

Preferably, the x-ray tube is positioned so that its electron beam is substantially parallel to the static magnetic field, i.e., so that the angle between the two is less than 15°, to minimize the work required to steer the electron beam onto the target. However, in some systems the misalignment between the direction of the external magnetic field and the desired direction of travel may be substantial.

Note that because the magnetic force is perpendicular to the electron velocity, the electron moves in a spiral trajectory if the magnetic field is not identically parallel to the electron velocity. Provided that the radius is small enough, the effect of the magnetic field is a slight change of the focal spot shape on the anode target. Some amount of broadening and other changes are acceptable, and therefore it is not necessary that the electrons travel in a perfectly straight line from cathode to anode.

Figure 4:
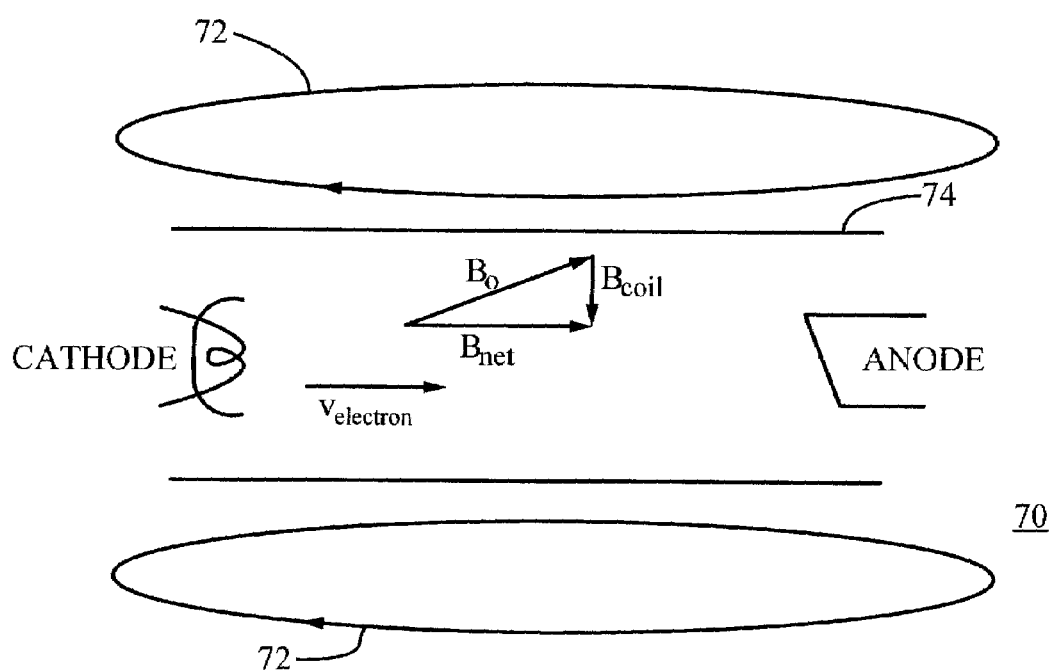
FIG. 4 is a schematic diagram of a first embodiment of an x-ray source of the apparatus of FIG. 3.

FIG. 4 shows the preferred embodiment of an x-ray source 70 of the present invention, referred to as the electromagnetic deflection embodiment. In this embodiment, the electron beam is steered toward the target using electromagnetic coils 72 positioned around the outside of an x-ray tube 74. Current flowing through the coils 72 generates an additional magnetic field $B_{coil}$ within the tube 74 that opposes the component of the static magnetic field perpendicular to the tube axis. Optimal steering of the electron beam on the target is provided when the net magnetic field in the tube is directed along the tube axis, i.e., when the component of the magnetic field perpendicular to the tube axis is zero. The current I in the coils 72 is selected so that the sum of the coil magnetic field $B_{coil}$ and the static magnetic field $B_o$ is directed only along the tube axis. For example, as shown in FIG. 4, the coils 72 create a magnetic field $B_{coil}$ that adds to the static magnetic field $B_o$ to produce a net magnetic field $B_{net}$ within the tube parallel to the tube axis. Of course, the coils 72 only affect the magnetic field locally, i.e., in the tube. The direction of the additional magnetic field can be reversed by reversing the direction of the current in the coils 72. To have full ability to generate transverse fields in any direction, additional coils 72 would be needed, as is known to those of skill in the art. For example, the system could use a pair such as the one shown in FIG. 4 to generate a transverse field in one direction, and another pair (not shown), rotated by 90°, to generate a transverse field rotated by 90°. Other arrangements of coils, capable of generating a magnetic field in an arbitrary direction perpendicular to the anode-cathode axis, can be used.

In this embodiment, a controller is provided to deliver the required current to produce a net magnetic field aligned with the tube axis, depending upon the relative orientation of the tube and the static magnetic field and the magnitude of $B_o$. With this system operational, the x-ray system can be rotated to achieve the desired projection while maintaining the desired location of the focal spot on the target.

The current required to oppose the undesired transverse field needs to be determined. This can be done during a calibration step and stored for later use, or a feedback system can be employed.

Figure 5:
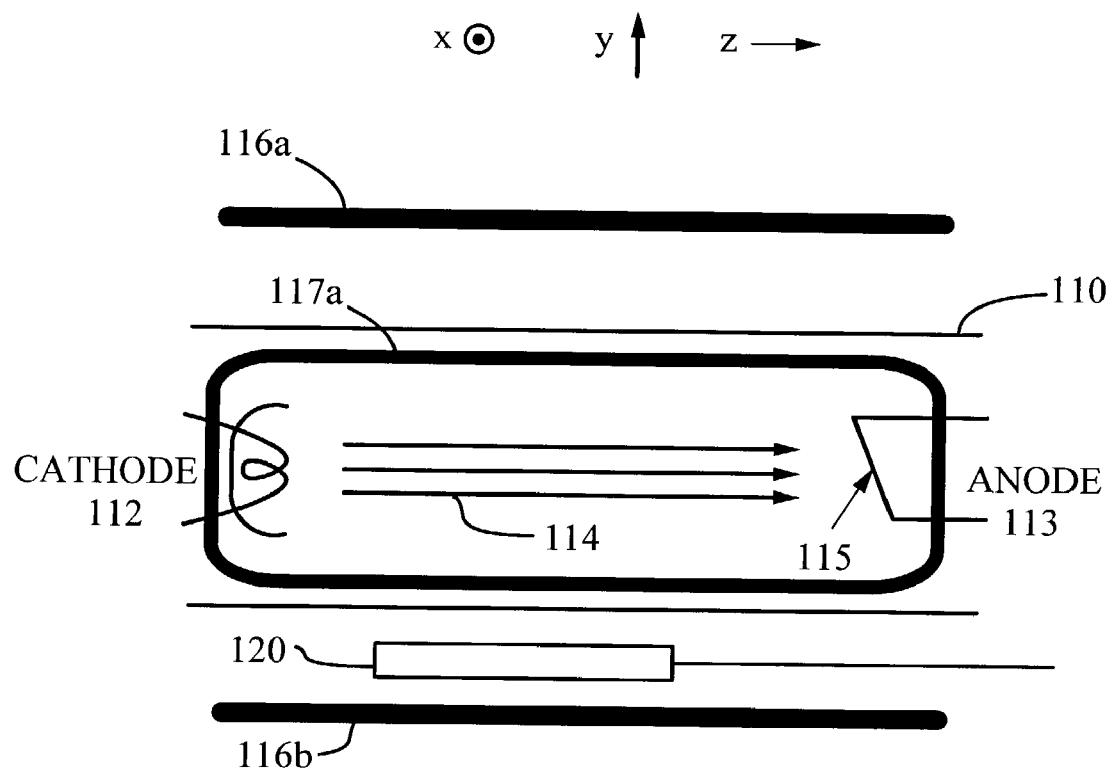
FIG. 5 illustrates an inventive technique for detecting the transverse magnetic fields of an x-ray source of the apparatus of FIG. 4.

One or more magnetic field sensors are used to detect the transverse magnetic fields. One such sensor 120 is shown in FIG. 5. The x-ray source 100 shown in FIG. 5 includes x-ray tube 110. As described above, during operation of the x-ray tube 110, the electron beam 114 is directed along the tube axis (z-axis) from the cathode (filament) 112 toward the anode 113, impinging at the focal spot 115. Coils 116a and 116b are used together to make a magnetic field in the y-direction. As described with reference to FIG. 4, the current in these coils is selected to oppose the component of the external magnetic field in this direction within the sensitive portion of the tube. Similarly, coils 117a and 117b (not shown) are used to control the magnetic field in the x-direction (in and out of the page in FIG. 5). According to an aspect of the invention, sensor 120 produces a signal dependent on the y component of the magnetic field. A similar sensor (not shown) would detect the magnetic field in the x direction. These signals are used to control the current in coils 116a, 116b, 117a and 117b. The goal is to choose the currents that produce zero signal in the sensors. The desired currents can be calibrated and tabulated, or used in a feedback system. The one or more magnetic field sensors could be any sensors that detect a transverse magnetic field, such as Hall effect probes. Although a linear relationship between the sensor signal and the transverse field being detected is preferred, the system can function even if the signal is not linear. For example, even if the signal gives only the direction of the magnetic field with little indication of its strength, the current in the appropriate coils can be adjusted until the sensor reading is approximately zero. An important advantage of this sensor approach is that the x-ray tube need not be energized (i.e. no x-ray tube current is needed) to allow nulling of the transverse magnetic fields. In FIG. 5, the sensor is shown outside the x-ray tube envelope, but it could be inside. Since the goal of the sensor is to produce a signal related to the transverse magnetic field experienced by the electrons inside the tube, a sensor inside the envelope might be preferred. On the other hand, this would require a specially designed x-ray tube and would be more complicated. Sensors symmetrically placed outside the tube can be used. If a single sensor that is sensitive separately to the two transverse field components is available, it could be used to control both the x- and y-directed coils.

This embodiment requires a current supplied to the compensating coils during x-ray image acquisition, and is therefore is referred to as an active embodiment. As such, it also benefits from use of a feedback system that allows automatic and appropriate choice of current. One such feedback system consists of two components: the first part is a sensor that measures a quantity related to the amount of additional correction needed; the second part uses the information obtained from the first part to modify the current, thereby changing the location of the focal spot and providing dynamic steering. Possible sensor implementations were discussed hereinbefore. The second component of the feedback system uses a standard controller to modify the current or potential as determined by the information acquired from the first component. It will be apparent to a person of average skill in the art how to implement such a controller.

It will be clear to one skilled in the art that the above embodiments may be altered in many ways without departing from the scope of the invention. Accordingly, the scope of the invention should be determined by the following claims and their legal equivalents.

What is claimed is:

1. An x-ray source positioned within an external magnetic field, said external magnetic field having a component transverse to an axis of said x-ray source, said x-ray source comprising:
   a magnetic field sensor for generating a signal sensitive to said transverse component.

2. The x-ray source of claim 1, further comprising:
   a first electromagnetic coil positioned such that when a selected current is applied to said coil, a first internal magnetic field is created within said x-ray source and a first transverse component of said first internal magnetic field opposes said transverse component of said external magnetic field.

3. The x-ray source of claim 2, wherein
   said x-ray source includes an x-ray tube; and
   said first internal magnetic field is created in a sensitive portion of said x-ray tube between a cathode and an anode.

4. The x-ray source of claim 2, further comprising:
   a second electromagnetic coil positioned to produce a second internal magnetic field having a second transverse component that is transverse to said x-ray source axis and substantially perpendicular to said first transverse component of said first internal magnetic field.

5. The x-ray source of claim 4, wherein
   said sensor is sensitive separately to said first and second transverse components of said first and second internal magnetic fields for controlling respective current applied to said first and second electromagnetic coils.

6. The x-ray source of claim 5, further comprising:
   a feedback means for adjusting said respective current according to an output of said sensor.

7. The x-ray source of claim 1, further comprising:
   a feedback means being operatively coupled to said magnetic field sensor and responsive to said signal from said magnetic field sensor.

8. The x-ray source of claim 1, wherein
   said sensor is a Hall effect probe.

9. A method for maintaining alignment of electric and magnetic fields in an x-ray source operated in a high magnetic field, wherein said high magnetic field has a component transverse to an axis of said x-ray source, said method comprising the steps of:
   detecting said transverse component with a magnetic field sensor;
   generating a corresponding signal dependent on said transverse component; and
   adjusting current applied to a first electromagnetic coil positioned in said x-ray source in accordance with said signal.

10. The method of claim 9, further comprising the step of:
    repeating said detecting, said generating, and said adjusting steps until said signal is effectively zero.

11. The method of claim 9, wherein
    said x-ray source includes an x-ray tube; and wherein
    said first electromagnetic coil is positioned such that when a selected current is applied to said coil, a first internal magnetic field is created within said x-ray tube in a sensitive portion between a cathode and an anode and a first transverse component of said first internal magnetic field opposes said transverse component of said external magnetic field.

12. The method of claim 11, wherein
    a second electromagnetic coil is positioned in said x-ray source to produce a second internal magnetic field having a second transverse component that is transverse to said x-ray tube axis and substantially perpendicular to said first transverse component of said first internal magnetic field.

13. The method of claim 12, wherein:
    in said detecting step, said first and second transverse components of said first and second internal magnetic fields are detected separately;
    in said generating step, corresponding signals are respectively generated in dependence of said first and second transverse components, respectively; and
    in said adjusting step, current is respectively applied to said first and second electromagnetic coils in accordance with said corresponding signals, respectively.

14. The method of claim 13, further comprising:
    repeating said detecting, said generating, and said adjusting steps until said corresponding signals respectively are effectively zero.

15. An x-ray source comprising:
    an x-ray tube having an axis extending from a cathode of said tube toward an anode of said tube; and
    a magnetic field sensor providing a signal sensitive to a magnetic field component transverse to said axis;
    whereby when said x-ray source is disposed in an external magnetic field, said signal is responsive to a transverse component of said external magnetic field.

* * * * *